United States Patent
Choi et al.

(10) Patent No.: US 10,566,221 B2
(45) Date of Patent: Feb. 18, 2020

(54) APPARATUS FOR TRANSFERRING SUBSTRATE AND APPARATUS FOR PROCESSING SUBSTRATE INCLUDING THE SAME

(71) Applicant: Samsung Electronics Co., Ltd., Suwon-si, Gyeonggi-do (KR)

(72) Inventors: Hyun Sun Choi, Suwon-si (KR); Yun-Kwang Jeon, Seoul (KR); Taekyun Kang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/142,916

(22) Filed: Sep. 26, 2018

(65) Prior Publication Data
US 2019/0067054 A1 Feb. 28, 2019

Related U.S. Application Data

(63) Continuation of application No. 15/260,874, filed on Sep. 9, 2016, now Pat. No. 10,103,043.

(30) Foreign Application Priority Data

Nov. 2, 2015 (KR) .......................... 10-2015-0153304

(51) Int. Cl.
*B01D 50/00* (2006.01)
*H01L 21/67* (2006.01)
(Continued)

(52) U.S. Cl.
CPC .... *H01L 21/67196* (2013.01); *B01D 46/0045* (2013.01); *B01D 46/4263* (2013.01);
(Continued)

(58) Field of Classification Search
CPC .............. B01D 50/00; B01D 46/0045; B01D 46/4263; B01D 46/448; H01L 21/67017; H01L 21/67724; H01L 21/67196; H01L 21/67778; H01L 21/67389; H01L 21/67248; H01L 21/67173; H01L 31/67742; H01L 21/67184;
(Continued)

(56) References Cited

U.S. PATENT DOCUMENTS 3,672,342 A 6/1972 Ojala
4,202,676 A 5/1980 Pelosi
(Continued)

FOREIGN PATENT DOCUMENTS

KR 10-1098981 B1 12/2011
KR 10-1417291 B1 7/2014

*Primary Examiner* — Min Chau T Pham
(74) *Attorney, Agent, or Firm* — Harness, Dickey & Pierce, P.L.C.

(57) ABSTRACT

The inventive concepts provide apparatuses for transferring a substrate and/or apparatuses for processing a substrate including the same. The substrate transferring apparatus including a chamber, a filter assembly disposed in a chamber to provide external air into the chamber, and an additional assembly including a moisture removing part and a purge gas providing part sequentially stacked on the filter assembly may be provided. The filter assembly may be coupled to the additional assembly.

20 Claims, 7 Drawing Sheets

(51) Int. Cl.
*H01L 21/673* (2006.01)
*H01L 21/677* (2006.01)
*B01D 46/00* (2006.01)
*B01D 46/42* (2006.01)
*B01D 46/44* (2006.01)

(52) U.S. Cl.
CPC ...... *B01D 46/448* (2013.01); *H01L 21/67017* (2013.01); *H01L 21/67167* (2013.01); *H01L 21/67173* (2013.01); *H01L 21/67184* (2013.01); *H01L 21/67201* (2013.01); *H01L 21/67248* (2013.01); *H01L 21/67389* (2013.01); *H01L 21/67742* (2013.01); *H01L 21/67778* (2013.01); *B01D 2279/45* (2013.01)

(58) Field of Classification Search
CPC .... H01L 21/67201; Y10S 55/18; Y10S 55/29; Y10S 55/46
USPC ........ 55/385.2, 356, 467.1, 490.1, 471, 473, 55/DIG. 10, DIG. 18, DIG. 29, DIG. 46; 454/187–189, 184, 191, 49, 56, 57; 95/73, 283; 96/16, 74, 225
See application file for complete search history.

(56) References Cited

U.S. PATENT DOCUMENTS

| | | | |
|---|---|---|---|
| 4,707,167 A | 11/1987 | Saito et al. | |
| 4,749,385 A | 6/1988 | Brunner et al. | |
| 6,129,781 A | 10/2000 | Okamoto et al. | |
| 6,251,170 B1 | 6/2001 | Hironaka et al. | |
| 6,299,668 B1 | 10/2001 | Penth et al. | |
| 6,494,934 B2 | 12/2002 | Fukushima | |
| 6,833,122 B2 | 12/2004 | Reisfeld | |
| 8,133,327 B2 | 3/2012 | Tokuno et al. | |
| 8,152,907 B2 * | 4/2012 | Moriya | B01D 46/0023 55/282.3 |
| 8,651,121 B2 * | 2/2014 | Orii | H01L 21/02052 134/134 |
| 10,103,043 B2 * | 10/2018 | Choi | B01D 46/0045 |
| 2003/0024393 A1 | 2/2003 | Lim | |
| 2005/0005585 A1 | 1/2005 | Kim | |
| 2012/0325797 A1 | 12/2012 | Furuya et al. | |
| 2014/0352741 A1 | 12/2014 | Nakamura | |

* cited by examiner

APPARATUS FOR TRANSFERRING SUBSTRATE AND APPARATUS FOR PROCESSING SUBSTRATE INCLUDING THE SAME

CROSS-REFERENCE TO RELATED APPLICATION

This U.S. non-provisional patent application is a continuation of U.S. application Ser. No. 15/260,874, filed on Sep. 9, 2016, now U.S. Pat. No. 10,103,043 B2, which claims priority under 35 U.S.C. § 119 to Korean Patent Application No. 10-2015-0153304, filed on Nov. 2, 2015, in the Korean Intellectual Property Office, the entire contents of each of the above-referenced applications are hereby incorporated by reference.

BACKGROUND

The inventive concepts relate to apparatuses for processing a substrate and, more particularly, to apparatuses for transferring a substrate and/or apparatuses for processing a substrate including the same.

In general, a semiconductor device is manufactured by a fabrication (FAB) process of forming an electrical circuit on a semiconductor substrate (e.g., a silicon wafer), a process of inspecting electrical characteristics of semiconductor devices formed by the FAB process, and a package assembling process of covering the semiconductor devices with an epoxy resin and of dividing the semiconductor devices from each other.

To improve productivity of semiconductor devices, equipment for processing a semiconductor substrate may include a load lock chamber for maintaining a semiconductor substrate at a relatively low vacuum, a process chamber for performing a semiconductor process, and a transfer chamber for transferring a semiconductor substrate between the load lock chamber and the process chamber. In particular, various problems may occur while a semiconductor substrate waits in the transfer chamber.

SUMMARY

Some example embodiments of the inventive concepts provide apparatuses for transferring a substrate, which are capable of inhibiting contamination in a transfer chamber, and apparatuses for processing a substrate including the same.

According to an example embodiment, an apparatus for transferring a substrate may include a chamber, a filter assembly in the chamber and the filter assembly configured to provide external air into the chamber, and an additional assembly on the filter assembly, the additional assembly configured to provide the external air to the filter assembly, the additional assembly including a moisture removing part and a purge gas providing part, the purging gas providing part on the moisture removing part.

In some example embodiments, the filter assembly may be coupled to the additional assembly.

In some example embodiments, the filter assembly may include a fan configured to provide the external air, and a filter under the fan. The filter may be configured to remove an impurity included in the external air received from the fan and provide the filtered external air into the chamber.

In some example embodiments, the moisture removing part may include a housing including a thermal insulating material, and at least one heater in the housing and having a path through which the external air passes.

In some example embodiments, the moisture removing part may further comprise a plurality of partition walls in the housing, the heater may include a plurality of heaters, one or more heater may be in each of spaces defined by the partition walls, and each of the heaters may have a hollow hexahedral structure, both ends of which are open.

In some example embodiments, the housing may include ceramic, and the heater may include nickel, chromium, or a nickel/chromium alloy.

In some example embodiments, the apparatus may further include a sensor configured to sense an inner temperature of the chamber, and a controller connected to the sensor and the heater. The controller may be configured to adjust a temperature of the heater based on the sensed temperature.

In some example embodiments, the purge gas providing part may include a housing, a nozzle on a side of the housing, a gas pipe in the housing and connected to the nozzle, the gas pipe including a plurality of holes, the holes defined at a bottom of the gas pipe and facing the moisture removing part, a purge gas storage part connected to the nozzle through a gas line, the purge gas storage part configured to provide a purge gas to the gas pipe, and a valve on the gas line.

In some example embodiments, the gas pipe may have a Y-shaped structure having three pipes extending in three directions different from each other.

In some example embodiments, the apparatus may further include a sensor in the chamber, the sensor configured to detect at least one of an oxygen concentration or a relative humidity of the external air received in the chamber, and a controller connected to the sensor and the valve. The controller may be configured to control closing and opening of the valve based on at least one of the oxygen concentration or the relative humidity detected by the sensor.

According to an example embodiment, an apparatus for transferring a substrate may include a chamber, a fan in the chamber and configured to provide external air, a filter under the fan and configured to receive the external air from the fan, remove an impurity included in the external air, and provide the impurity-removed external air into the chamber, a nitrogen gas providing part on the fan and configured to inject a nitrogen gas into the chamber, and a heating part between the nitrogen gas providing part and the fan and configured to remove moisture included in the external air.

In some example embodiments, the apparatus may further include a sensor in the chamber and configured to sense at least one of an oxygen concentration, a relative humidity, or a temperature in the chamber, and a controller connected to the sensor, the nitrogen gas providing part, and the heating part, the controller configured to control the nitrogen gas providing part and the heating part based on some of at least one of the oxygen concentration, the relative humidity, or the temperature sensed by the sensor.

In some example embodiments, the nitrogen gas providing part may include a gas pipe having a Y-shaped structure. The gas pipe may include a plurality of holes at a bottom thereof.

In some example embodiments, the heating part may include a plurality of heaters. Each of the heaters may have a hollow hexahedral structure, both ends of which are open. The heaters may include nickel, chromium, or a nickel/chromium alloy.

According to an example embodiment, an apparatus for processing a substrate may include a transfer module including a load port, a first transfer chamber mentioned in the foregoing, and a first transfer robot, a processing module including a plurality of process chambers, a second transfer chamber, and a second transfer robot, and a load lock chamber disposed between the transfer module and the processing module.

According to an example embodiment, a semiconductor manufacturing equipment may include a chamber, a filter in the chamber, the filter configured to allow external air into the chamber, and a moisture removing part configured to remove moisture in the external air with heat and provide de-moisturized external air to the filter.

In some example embodiments, the moisture removing part may include a housing including a thermal insulating material, and a plurality of hollow columnar heaters in the housing, the hollow columnar heaters arranged in longitudinal and traverse directions, each of the heaters having a passage through which the external air passes.

In some example embodiments, the equipment may further include a purge gas providing part on the moisture removing part, the purge gas providing part configured to provide a purge gas to reduce an amount of oxygen in the external air and provide the purge gas and the oxygen-reduced external air to the moisture removing part.

In some example embodiments, the equipment may further include at least one sensor configured to sense at least one of a temperature, a humidity, or an oxygen concentration in the chamber, and at least one controller configured to adjust at least one of a supply of the purge gas from the purge gas providing part or a temperature of the heaters based on the sensed results.

In some example embodiments, the purge gas providing part may include a housing, a nozzle on a side of the housing, and a gas pipe in the housing and connected to the nozzle, the gas pipe including a plurality of holes, the holes defined at a bottom of the gas pipe and facing the moisture removing part.

BRIEF DESCRIPTION OF THE DRAWINGS

The inventive concepts will become more apparent in view of the attached drawings and accompanying detailed description.

DETAILED DESCRIPTION

Figure 1:
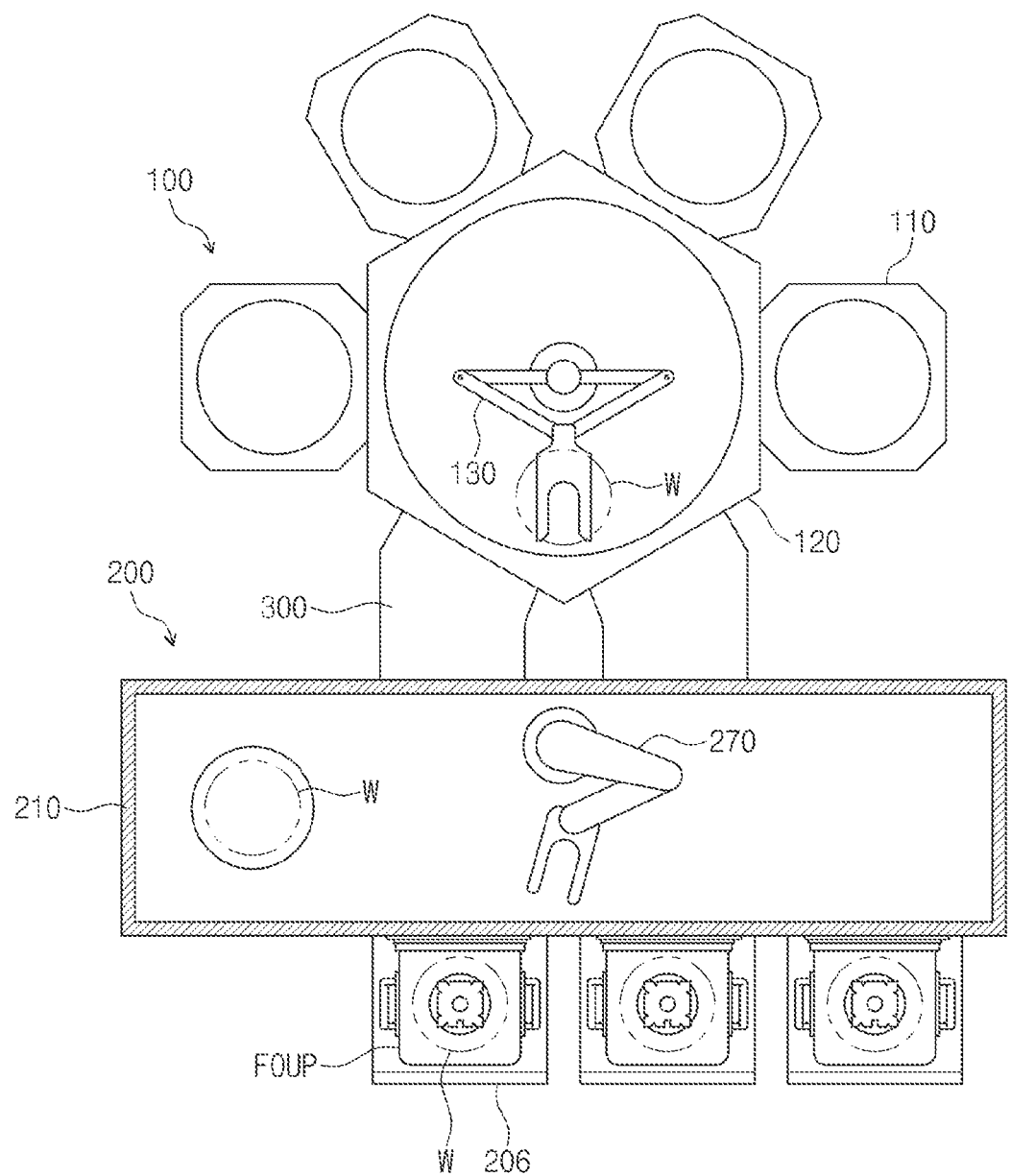
FIG. 1 is a plan view illustrating an apparatus for processing a substrate, according to an example embodiment of the inventive concepts.

The inventive concepts will now be described more fully hereinafter with reference to the accompanying drawings, in which some example embodiments of the inventive concepts are shown. The inventive concepts and methods of achieving them will be apparent from the following example embodiments that will be described in more detail with reference to the accompanying drawings. The example embodiments of the inventive concept may, however, be embodied in different forms and should not be constructed as limited to the example embodiments set forth herein. Rather, these example embodiments are provided so that this disclosure will be thorough and complete, and will fully convey the scope of the inventive concept to those skilled in the art.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Some example embodiments of aspects of the present inventive concepts explained and illustrated herein include their complementary counterparts. The same reference numerals or the same reference designators denote the same elements throughout the specification.

As used herein, the term "and/or" includes any and all combinations of one or more of the associated listed items. Expressions such as "at least one of," when preceding a list of elements, modify the entire list of elements and do not modify the individual elements of the list. Thus, for example, both "at least one of A or B" and "A and/or B" includes any and all combination of the associated listed items A and B.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
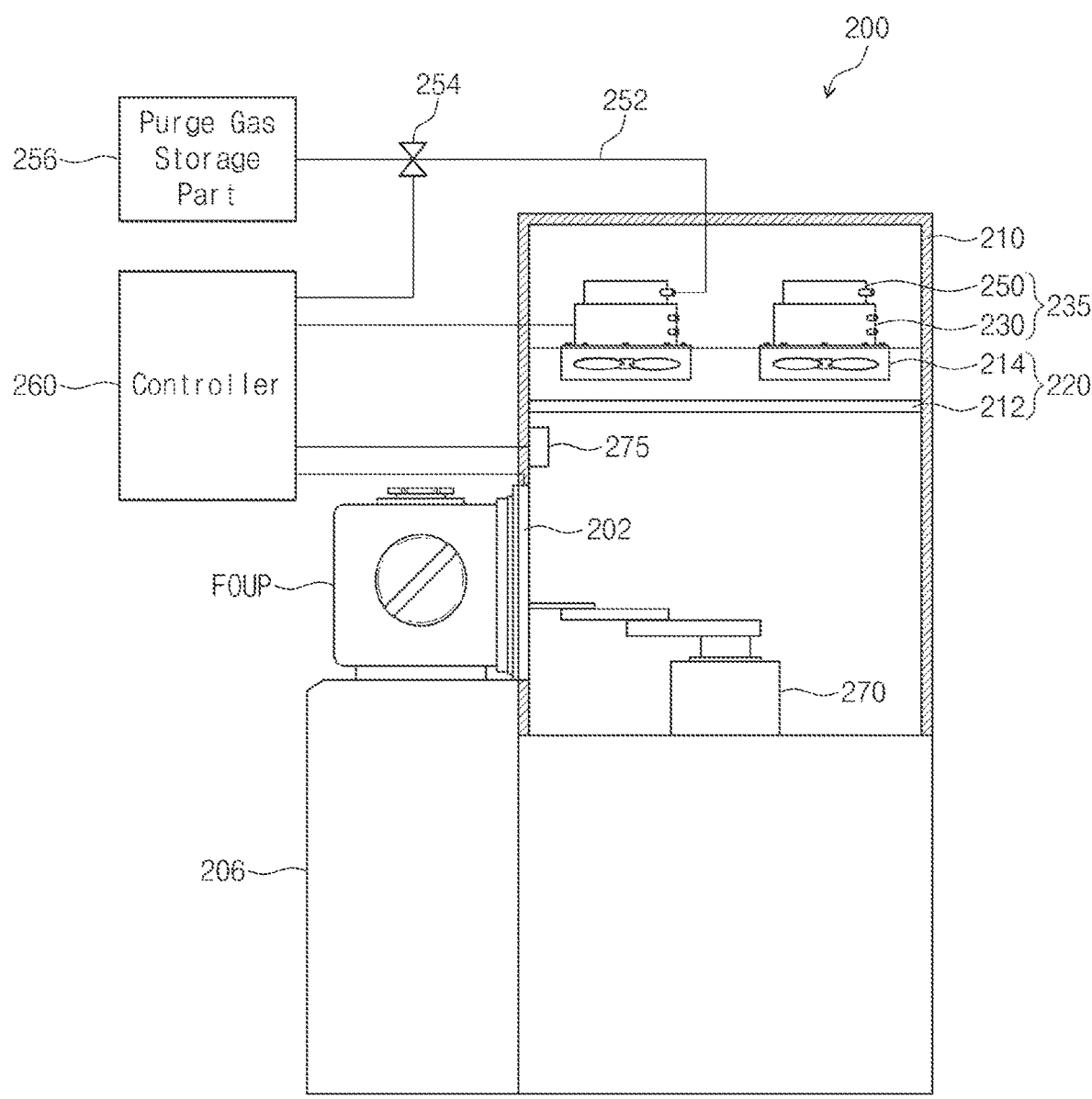
FIG. 2 is a cross-sectional view illustrating a transfer module (or a transfer apparatus) of an apparatus for processing a substrate, according to an example embodiment of the inventive concepts.
Figure 3:
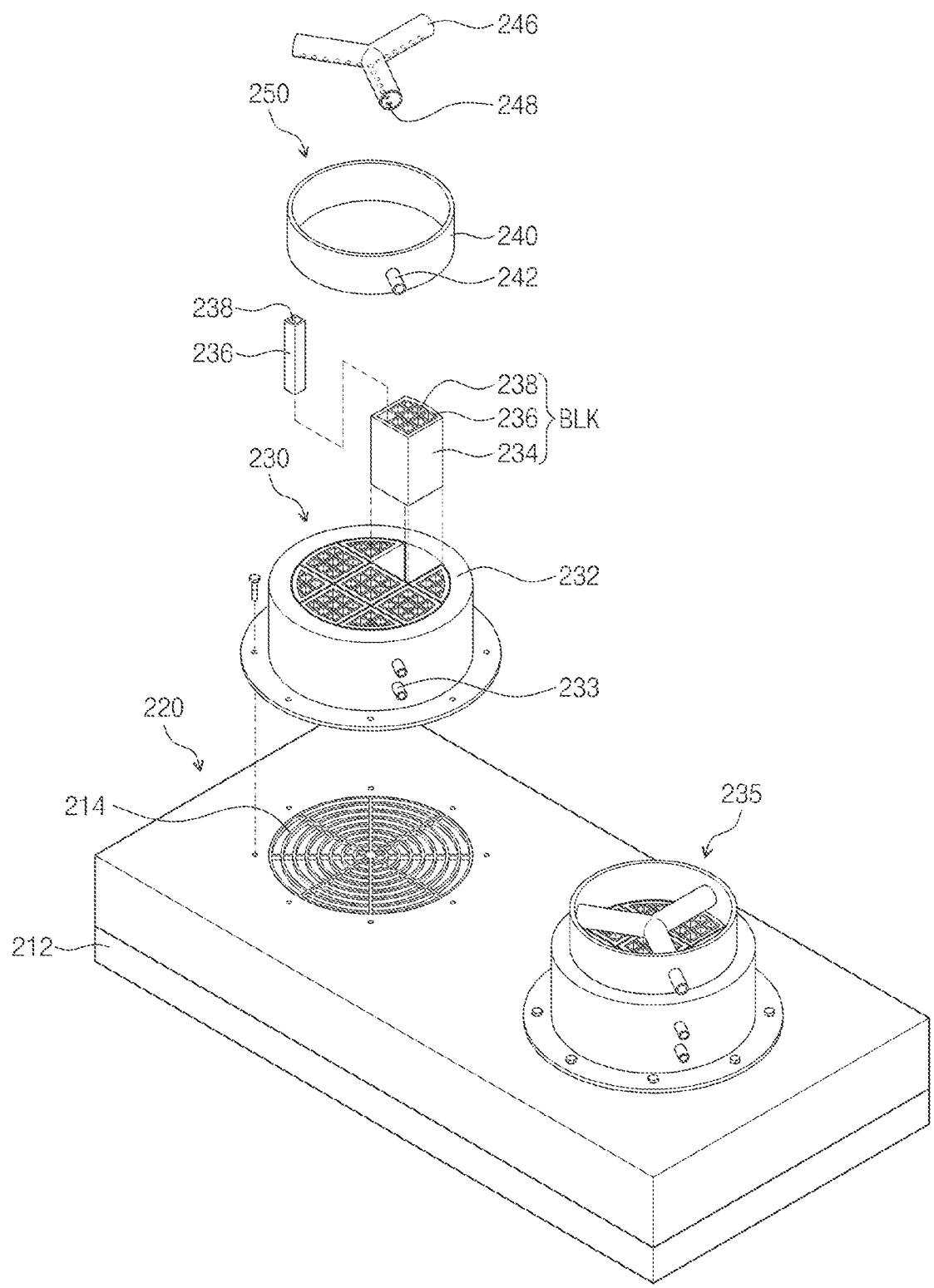
FIG. 3 is an exploded perspective view illustrating a filter assembly and an additional assembly of an apparatus for processing a substrate, according to an example embodiment of the inventive concepts.
Figure 4:
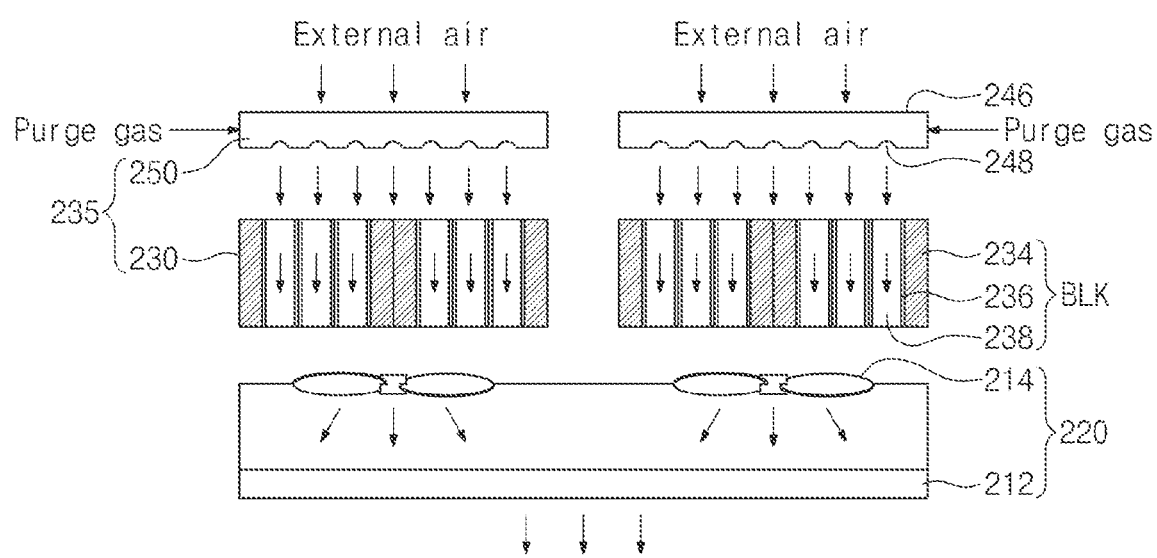
FIG. 4 is a cross-sectional view illustrating a flow of external air and a flow of a purge gas in the filter assembly and the additional assembly of an apparatus for processing a substrate, according to an example embodiment of the inventive concepts.
Figure 5:
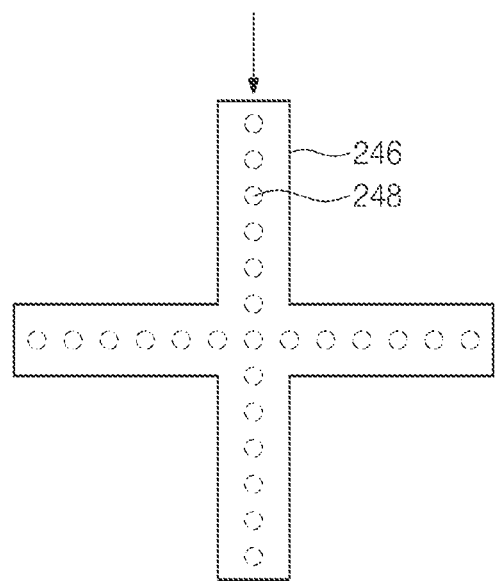
FIGS. 5 to 7 are plan views illustrating some examples of a gas pipe of an apparatus for processing a substrate, according to some example embodiments of the inventive concepts.
Figure 6:
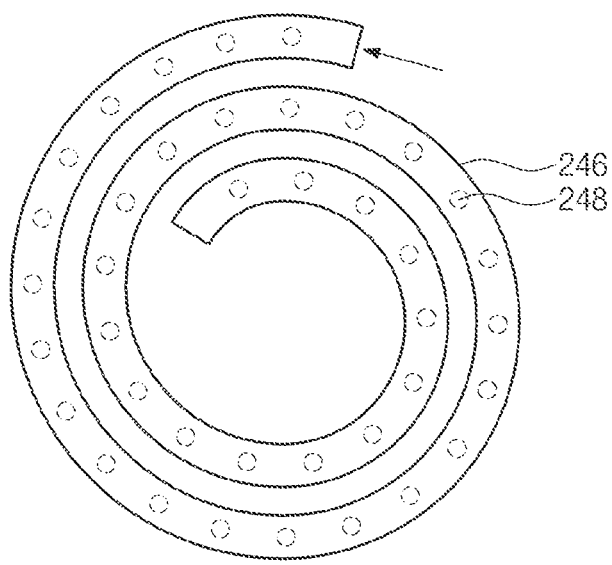
Figure 7:
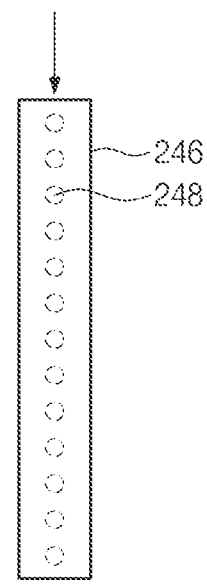

FIG. 1 is a plan view illustrating an apparatus for processing a substrate, according to an example embodiment of the inventive concepts. FIG. 2 is a cross-sectional view illustrating a transfer module (or a transfer apparatus) of an apparatus for processing a substrate, according to an example embodiment of the inventive concepts. FIG. 3 is an exploded perspective view illustrating a filter assembly and an additional assembly of an apparatus for processing a substrate, according to an example embodiment of the inventive concepts. FIG. 4 is a cross-sectional view illustrating a flow of external air and a flow of a purge gas in the filter assembly and the additional assembly of an apparatus for processing a substrate, according to an example embodiment of the inventive concepts. FIGS. 5 to 7 are plan views illustrating some examples of a gas pipe of an apparatus for processing a substrate, according to some example embodiments of the inventive concepts.

Referring to FIGS. 1 and 2, an apparatus for processing a substrate W may include a transfer module 200, a load lock chamber 300, and a processing module 100. The transfer module 200 may correspond to a transfer apparatus.

The transfer module 200 may include a load port 206, a first transfer chamber 210, a first transfer robot 270, a filter assembly 220, and an additional assembly 235.

The load port 206 may be connected to the first transfer chamber 210 and may support a container receiving a plurality of substrates W. A front opening unified pod (FOUP) may be used as the container. The plurality of substrates W may be vertically stacked in the FOUP, and the FOUP may be transferred in a closed state to protect the received substrates W from external contaminants.

The load port 206 may bring a door of the front opening unified pod FOUP into contact with a door 202 of the first transfer chamber 210. Even though not shown in the drawings, a door opener for closing and opening the door of the FOUP may be disposed at a lower portion of the load port 206 and may be connected to an inner sidewall of the first transfer chamber 210. The door opener may open the door 202 of the first transfer chamber 210 and the door of the FOUP which is in contact with the door 202 of the first transfer chamber 210 by the load port 206.

The first transfer robot 270 may be disposed in the first transfer chamber 210 and may transfer a substrate W between the FOUP supported by the load port 206 and the load lock chamber 300.

In some example embodiments, a sensor 275 may be disposed in the first transfer chamber 210. One sensor 275 is illustrated in the present example embodiment. However, example embodiments of the inventive concepts are not limited thereto. In some example embodiments, a plurality of sensors may be disposed at different positions from each other in the first transfer chamber 210. The sensor 275 may sense at least one of a temperature, an oxygen concentration, or a relative humidity of the inside of the first transfer chamber 210. The sensor 275 may be connected to a control unit 260.

Referring to FIGS. 2 to 4, the filter assembly 220 may provide external air into the first transfer chamber 210. In addition, even though not shown in the drawings, a plurality of pipes for exhausting the external air may be connected to a bottom of the first transfer chamber 210.

The filter assembly 220 may be a fan filter assembly (FFU) in which a fan 214 and a filter 212 are in one united or integral body. The filter assembly 220 may generate a downward flow of clean air into the first transfer chamber 210. The fan 214 may include an impeller generating the flow of air and a casing guiding the air provided to the impeller. Even though not shown in detail in the drawings, the impeller may be a rotatable cylinder having a plurality of wings disposed at equal intervals, and the fan 214 may be connected to a driving unit (not shown) to rotate the impeller.

To remove a contaminant, the filter 212 may include a high efficiency particulate air (HEPA) filter or an ultra-low penetration air (ULPA) filter. In some example embodiments, the filter 212 may further include a chemical filter collecting a chemical material.

The additional assembly 235 may be coupled to the filter assembly 220. In some example embodiments, the filter assembly 220 may be provided in plurality, and the additional assembly 235 may also be provided in plurality. In this case, the additional assemblies 235 may be coupled to the filter assemblies 220, respectively. The additional assembly 235 may include a purge gas providing part 250 and a moisture removing part 230. The moisture removing part 230 may be disposed between the purge gas providing part 250 and the filter assembly 220.

The purge gas providing part 250 may provide a purge gas (e.g., a nitrogen ($N_2$) gas) into the first transfer chamber 210 to reduce the amount of oxygen in the external air flowing into the first transfer chamber 210. According to the present example embodiment, referring to FIGS. 2 and 3, the purge gas providing part 250 may include a first housing 240, a nozzle 242 formed on a side of the first housing 240, a gas pipe 246 connected to the nozzle 242, and a purge gas storage part 256 connected to the nozzle 242 to provide the purge gas.

A plurality of holes 248 may be formed at one surface of the gas pipe 246, and may be configured to face the moisture removing part 230. The purge gas and the external air may be provided to the moisture removing part 230 through the plurality of holes 248. As illustrated in FIG. 3, the gas pipe 246 may have a Y-shaped structure having three pipes extending in three directions different from each other. The three pipes branching in the three directions may be spaced at 120 degree intervals. In some example embodiments, as illustrated in FIG. 5, the gas pipe 246 may have a cross-shaped structure. In some example embodiments, as illustrated in FIG. 6, the gas pipe 246 may have a coil-shaped structure. In some example embodiments, as illustrated in FIG. 7, the gas pipe 246 may have a line-shaped structure. However, example embodiments of the inventive concepts are not limited to the shapes of the gas pipe 246 illustrated in the above example embodiments. In FIGS. 5 to 7, the reference numerals 248 indicate the holes 248 formed in the gas pipe 246.

The purge gas providing part 250 may further include a gas line 252 connecting the purge gas storage part 256 to the nozzle 242, and a valve 254 may be installed on the gas line 252. The valve 254 may be connected to the control unit 260. Opening and closing operations of the valve 254 may be controlled according to the oxygen concentration and the relative humidity in the first transfer chamber 210 by the control unit 260. In some example embodiments, when the door of the first transfer chamber 210 is opened for maintenance of the first transfer chamber 210, the valve 254 may be automatically closed to interrupt the supply of the purge gas.

The moisture removing part 230 may remove moisture ($H_2O$) in the external air. According to the present example embodiment, the moisture removing part 230 may include a second housing 232 and a heater 236 disposed in the second housing 232. Each of the heaters 236 may include a path 238 through which the external air and the purge gas pass through. In some example embodiments, the second housing 232 may include a thermal insulating material such as ceramic. The second housing 232 may include a plurality of blocks BLK. Each of the blocks BLK may include a partition wall 234 and one or more heaters 236 disposed in a space surrounded by the partition wall 234. The blocks BLK may be partitioned by the partition walls 234. The partition walls 234 may include a thermal insulating material such as ceramic. Each of the heaters 236 may have a hollow hexahedral structure (e.g., a hollow columnar structure), top and bottom ends of which are opened. The heaters 236 may be spaced apart from each other in longitudinal and transverse directions when viewed from a plan view.

The heater 236 may be formed of metal having a relatively high melting point and a relatively high specific heat. For example, the heater 236 may be formed of nickel (Ni), chromium (Cr), or a nickel/chromium (Ni/Cr) alloy. A port 233 may be installed on the second housing 232. The port 233 may be electrically connected to a power supply unit (not shown) for providing a current to the heaters 236. In some example embodiments, the heater 236 may be a heating coil. However, example embodiments of the inventive concepts are not limited to the aforementioned kinds of the heater 236.

The heaters 236 may be uniformly arranged in the second housing 232, and thus the external air and the purge gas provided into the heaters 236 may be uniformly heated.

Because the heater 236 has the hollow hexahedral column structure having the opened both ends as described above, a contact area between the heater 236 and the external air passing through the path 238 defined in the heater 236 may be sufficiently provided. Further, because the heater 236 is formed of the metal having a relatively high specific heat and a relatively high melting point, a method of forming the heater 236 may be simplified.

According to some example embodiments, the sensor 275 may sense the temperature of the inside of the first transfer chamber 210. The control unit 260 may be connected to the heaters 236 to adjust a temperature of the heaters 236 depending on the temperature sensed from the sensor 275.

Referring to FIG. 4, the amount of oxygen included in the external air may be reduced by the purge gas providing part 250, and moisture included in the external air may be removed by the moisture removing part 230. Thus, highly clean air may be provided into the first transfer chamber 210. In other words, the additional assembly 235 may convert the external air into the highly clean air, which is substantially devoid of, for example, oxygen and moisture ($H_2O$).

As a result, equipment corrosion or harmful gas, which may be caused by combining the moisture with gas generated from a pattern or layer formed on a substrate W, may be inhibited or prevented. For example, a silicon nitride layer formed on a substrate W may be etched using an etching gas including fluorine (F) or chlorine (Cl) to form a pattern. In this case, etch residues (e.g., $NH_3$, $Cl^-$, and/or $F^-$) may exist on or in the pattern after the formation of the pattern. In order to prepare for a subsequent process, these etch residues may be exhausted in gaseous form while the substrate W is on standby. An ammonia ($NH_3$) gas may be combined with the moisture to generate $OH^-$ as represented in the following chemical formula (1). The $OH^-$ may be combined with silicon to generate $SiO_x$ and/or $SiO_xH_y$. The $SiO_x$ and/or $SiO_xH_y$ may increase an interface resistance.

$$NH_3 + H_2O \rightarrow NH_4^+ + OH^- \qquad (1)$$

Meanwhile, a fluorine ion ($F^-$) may be combined with the moisture to form a harmful hydrofluoric acid gas as represented in the following chemical formula (2).

$$F^- + H_2O \rightarrow HF + OH^- \qquad (2)$$

However, according to some example embodiments of the inventive concepts, the moisture included in the external air may be removed using the moisture removing part 230, thereby solving the above problems.

Referring to FIG. 1, the load lock chamber 300 may be connected between the transfer module 200 and the processing module 100 and may temporarily receive a substrate W transferred from the first transfer chamber 210. Even though not shown in the drawings, the load lock chamber 300 may be connected to a vacuum generating unit, and thus the inside of the load lock chamber 300 may be maintained at a vacuum.

The processing module 100 may include a plurality of process chambers 110, a second transfer chamber 120, and a second transfer robot 130. The load lock chamber 300 may be connected to the plurality of process chambers 110 through the second transfer chamber 120. In other words, the load lock chamber 300 may be connected to at least one side of the second transfer chamber 120, and the plurality of process chambers 110 may be connected to other sides of the second transfer chamber 120. The second transfer robot 130 may be disposed in the second transfer chamber 120 to transfer a substrate between the load lock chamber 300 and the process chambers 110 and/or between the process chambers 110.

Figure 8:
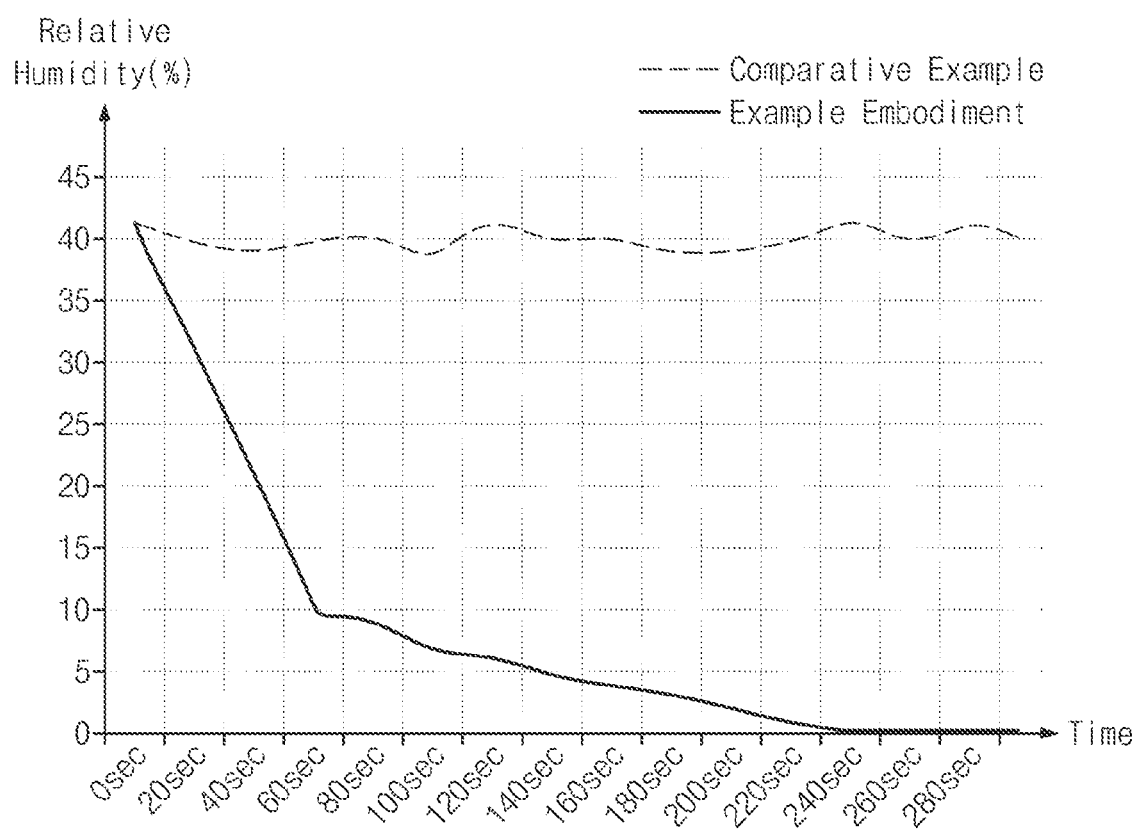
FIG. 8 is a graph illustrating a relative humidity in a first transfer chamber according to a comparative example and a relative humidity in a first transfer chamber according to an example embodiment of the inventive concepts.
Figure 9:
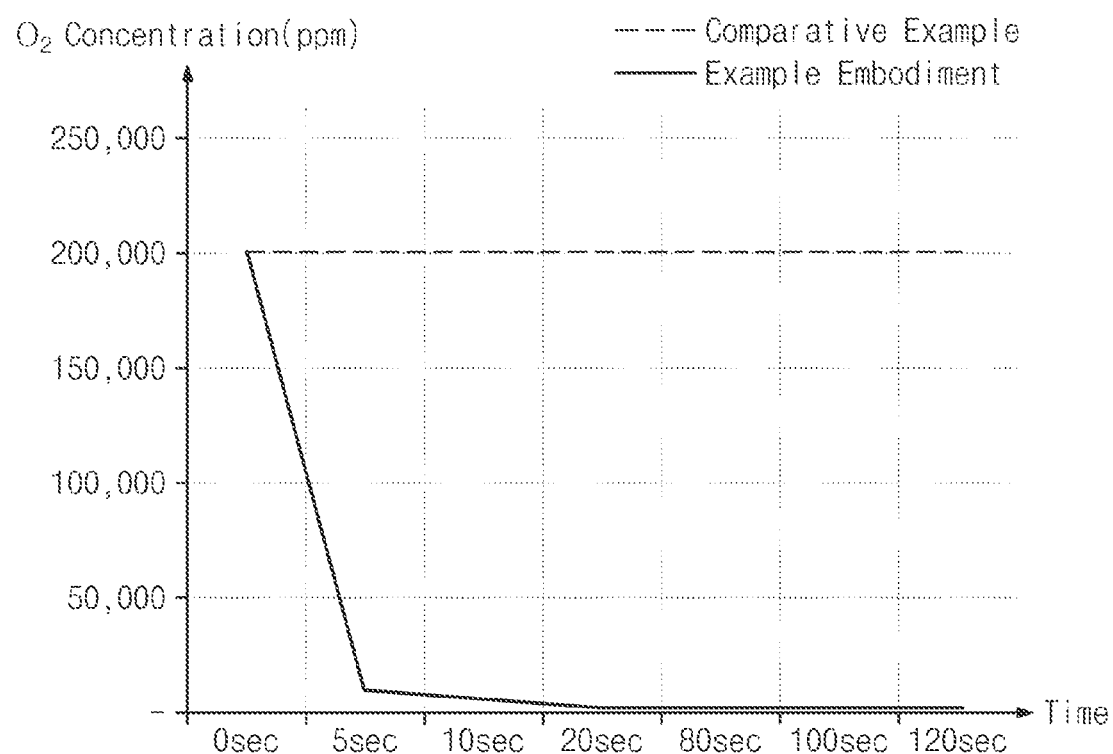
FIG. 9 is a graph illustrating an oxygen concentration in a first transfer chamber according to a comparative example and an oxygen concentration in a first transfer chamber according to an example embodiment of the inventive concepts.

FIG. 8 is a graph illustrating a relative humidity in a first transfer chamber according to a comparative example and a relative humidity in a first transfer chamber according to an example embodiment of the inventive concepts. FIG. 9 is a graph illustrating an oxygen concentration in a first transfer chamber according to a comparative example and an oxygen concentration in a first transfer chamber according to an example embodiment of the inventive concepts.

Referring to FIGS. 8 and 9, a moisture removing part is not installed in a first transfer chamber according to a comparative example, whereas the moisture removing part is installed in the first transfer chamber according to the example embodiment of inventive concepts. Other elements of the first transfer chamber according to the comparative example are the same as corresponding elements of the first transfer chamber according to the example embodiment of the inventive concepts.

Referring to FIG. 8, because the moisture removing part is installed in the first transfer chamber according to the example embodiment, the relative humidity in the first transfer chamber is reduced to substantially 0% as time passes. On the contrary, the relative humidity in the first transfer chamber according to the comparative example is maintained in a range of about 40% to about 45% even though time passes. Etch residues may be combined with moisture in the first transfer chamber of the comparative example, in which the relative humidity is in the range of about 40% to about 45%, and thus equipment may corrode and/or harmful gas may occur.

Referring to FIG. 9, a nitrogen gas was injected into the first transfer chamber according to the example embodiment to perform a purge process, and then, an oxygen concentration in the first transfer chamber of the example embodiment was measured. As illustrated in FIG. 9, the oxygen concentration of the first transfer chamber according to the example embodiment is rapidly reduced as time passes. In addition, a nitrogen gas was injected into the first transfer chamber according to the comparative example, and then, an oxygen concentration in the first transfer chamber of the comparative example was measured. Unlike the example embodiment, the oxygen concentration in the first transfer chamber of the comparative example was maintained at about 200,000 ppm as illustrated in FIG. 9.

According to some example embodiments of the inventive concepts, the moisture included in the external air may be removed by the moisture removing part to inhibit or prevent the problems which may be caused by the moisture. Further, each of the heaters of the moisture removing part may have the hollow hexahedral structure. Thus, the contact area between the external air and the heater may be sufficiently provided. Moreover, the gas pipe of the purge gas providing part may have the Y-shaped structure. Thus, the purge gas may be uniformly provided through the gas pipe. Furthermore, the temperature, the relative humidity, and the oxygen concentration in the transfer chamber may be adjusted by, for example, the sensor and the control unit.

While the inventive concepts have been described with reference to some example embodiments, it will be apparent to those skilled in the art that various changes and modifications may be made without departing from the spirits and scopes of the inventive concepts. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. A method for transferring a substrate, the method comprising:
providing a container storing the substrate on a load port adjacent a first transfer chamber;
providing a purge gas into the first transfer chamber, the purge gas including a nitrogen gas;
opening a door of the container to connect the container to the first transfer chamber;
transferring the substrate in the first transfer chamber into a load lock chamber connected to the first transfer chamber; and
providing the substrate in a process chamber,
wherein the providing the purge gas into the first transfer chamber comprises,
providing the purge gas, using a nozzle, into the first transfer chamber,
heating the purge gas using a heater between the nozzle and a filter, and collecting a chemical material in the purge gas using the filter under the heater, and
wherein the nozzle is configured to inject the nitrogen gas included in the purge gas into the heater such that the nitrogen gas heated by the heater is provided to the first transfer chamber and the container accommodated in the first transfer chamber, and removes an oxygen therein.

2. The method of claim 1, wherein the providing the purge gas further comprises generating a downward flow of the purge gas into the first transfer chamber using a fan between the filter and the heater.

3. The method of claim 1, wherein the heating the purge gas comprises sensing a temperature of the purge gas using a sensor on a wall of the first transfer chamber between the door of the first transfer chamber and the filter to control the temperature of the purge gas.

4. The method of claim 1, wherein the providing the purge gas further comprises exhausting the purge gas in the first transfer chamber using a pipe connected to a bottom of the first transfer chamber.

5. The method of claim 1, wherein the providing the purge gas comprises reducing an amount of oxygen in an external air flowing into the first transfer chamber.

6. The method of claim 5, wherein the heating the purge gas comprises removing moisture in the external air by a moisture removing part.

7. The method of claim 1, further comprising:
transferring the substrate into a second transfer chamber between the load lock chamber and the process chamber.

8. The method of claim 1, wherein
the heater has a plurality of heater holes, and
the nozzle has a plurality of nozzle holes, and the nozzle is on the heater.

9. A method for processing a substrate, the method comprising:
transferring the substrate using a transferring module including first and second transfer chambers; and
processing the substrate using a processing module including a process chamber, wherein the transferring the substrate comprises,
   providing a purge gas into the first transfer chamber, the purge gas including a nitrogen gas,
   transferring the substrate into the first transfer chamber, and
   transferring the substrate into the process chamber,
wherein the providing the purge gas in the first transfer chamber comprises,
   providing the purge gas, using a nozzle, into the first transfer chamber,
   heating the purge gas using a heater between the nozzle and a filter, and
   collecting a chemical material in the purge gas using the filter under the heater, and
wherein the nozzle is configured to inject the nitrogen gas included in the purge gas into the heater such that the nitrogen gas heated by the heater is provided to the first transfer chamber, and removes an oxygen therein.

10. The method of claim 9, wherein the providing the purge gas further comprises generating a downward flow of the purge gas into the first transfer chamber using a fan between the filter and the heater.

11. The method of claim 9, wherein the heating the purge gas comprises adjusting a temperature of the heater depending on a temperature of an inside of the first transfer chamber using a sensor in the first transfer chamber.

12. The method of claim 9, wherein the providing the purge gas further comprises exhausting the purge gas in the first transfer chamber using a pipe connected to a bottom of the first transfer chamber.

13. The method of claim 9, wherein the providing the purge gas comprises reducing an amount of oxygen in an external air flowing into the first transfer chamber.

14. The method of claim 9, wherein the transferring the substrate further comprises:
   transferring the substrate into a load lock chamber between the first and second transfer chamber; and
   transferring the substrate into the second transfer chamber between the load lock chamber and the process chamber.

15. A method for transferring a substrate, the method comprising:
   providing a purge gas into a first transfer chamber, the purge gas including a nitrogen gas;
   transferring the substrate into the first transfer chamber;
   transferring the substrate into a process chamber; and
   processing the substrate in the process chamber,
wherein the providing the purge gas into the first transfer chamber comprises,
   providing the purge gas, using a nozzle, into the first transfer chamber,
   removing moisture in an external air using a moisture removing part under the nozzle, and
   collecting a chemical material in the purge gas using a filter under the moisture removing part, and
wherein the nozzle is configured to inject the nitrogen gas included in the purge gas into the heater such that the nitrogen gas heated by the heater is provided to the first transfer chamber, and removes an oxygen therein.

16. The method of claim 15, wherein the providing the purge gas further comprises generating a downward flow of the purge gas into the first transfer chamber using a fan between the filter and the moisture removing part.

17. The method of claim 15, wherein the removing the moisture in the external air comprises heating the external air and the purge gas using the moisture removing part including a heater.

18. The method of claim 17, wherein the removing the moisture in the external air further comprises adjusting a temperature of the heater of an inside of the first transfer chamber using a sensor in the first transfer chamber.

19. The method of claim 15, wherein the providing the purge gas further comprises exhausting the purge gas in the first transfer chamber using a pipe connected to a bottom of the first transfer chamber.

20. The method of claim 15, wherein the providing the purge gas comprises reducing an amount of oxygen in the external air flowing into the first transfer chamber.

* * * * *